United States Patent [19]

Popyack, Jr.

[11] Patent Number: 5,224,101

[45] Date of Patent: Jun. 29, 1993

[54] MICRO-CODED BUILT-IN SELF-TEST APPARATUS FOR A MEMORY ARRAY

[75] Inventor: Leonard J. Popyack, Jr., Clark Mills, N.Y.

[73] Assignee: The United States of America as represented by the Secretary of the Air Force, Washington, D.C.

[21] Appl. No.: 523,968

[22] Filed: May 16, 1990

[51] Int. Cl.[5] .................. G11C 29/00; G06F 11/00
[52] U.S. Cl. ......................... 371/21.1; 371/21.2; 371/15.1
[58] Field of Search .............. 371/21.1, 21.2, 67.1, 371/71, 15.1, 10.1, 27; 364/200

[56] References Cited

U.S. PATENT DOCUMENTS

| | | |
|---|---|---|
| 4,490,783 | 12/1984 | McDonough et al. ............. 364/200 |
| 4,502,140 | 2/1985 | Proebsting ............................ 371/28 |
| 4,667,330 | 5/1987 | Kumagai ............................... 371/71 |
| 4,752,929 | 6/1988 | Kantz et al. ...................... 371/24 X |
| 4,823,307 | 4/1989 | Melgara et al. ................ 371/16.1 X |
| 4,912,710 | 3/1990 | Rolfe ............................... 371/21.1 X |
| 5,073,891 | 12/1991 | Patel ............................... 371/21.1 X |

Primary Examiner—Robert W. Beausoliel, Jr.
Assistant Examiner—Allen M. Lo
Attorney, Agent, or Firm—William Stepanishen; Donald J. Singer

[57] ABSTRACT

A built-in self-test apparatus for a memory cell array having a micro-code sequencer to receive and utilize micro-instruction from a read only memory. The micro-code sequencer applies test algorithms to each cell of the memory cell array and detects the responses to determine the operational status of the memory cell array.

9 Claims, 3 Drawing Sheets

MICRO-CODED BUILT-IN SELF-TEST APPARATUS FOR A MEMORY ARRAY

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a memory test apparatus, and in particular to a micro-coded built-in self-test apparatus for a memory cell array.

In the prior art, a variety of techniques have been utilized to provide built-in self-test (BIST) of memory devices employed random logic to define the type of memory test to be performed on cells in the array. A disadvantage of the random logic approach is that it allows only a specific test to be run on a memory device unless a complete redesign of the random logic is performed. Limitations on memory test algorithm complexity becomes significant for complex memory test algorithms. In addition, random logic devices are poor performers for data retention tests from the perspective of chip area for BIST.

While the prior art approaches to providing built-in self-test circuits have been functional, it is quite clear that there remains a need to provide a built-in self-test apparatus for random access memory arrays. The present invention is intended to satisfy that need.

SUMMARY OF THE INVENTION

The present invention utilizes a micro-coded sequencer unit which receives micro-instructions from a read only memory to test random access memory cell arrays. Test algorithms which are stored in the read only memory, are in the form of micro-instructions which are utilized by the sequencer unit. The use of stored test algorithms provides built-in self-test flexibility since the algorithms may be easily changed or updated to achieve enhanced fault coverage or more efficient execution.

It is one object of the present invention, therefore, to provide an improved micro-coded built-in self-test apparatus for a memory cell array.

It is another object of the invention to provide an improved micro-coded built-in self-test apparatus wherein the use of micro-coded instructions from a read only memory unit results in a chip area savings that would be otherwise dedicated to the built-in self-test function.

It is still another object of the invention to provide an improved micro-coded built-in self-test apparatus wherein data retention fault detection is easily supported and achieved.

It is yet another object of the invention to provide an improved micro-coded built-in self-test apparatus wherein the test algorithms may be changed much more easily than that of random logic BIST devices.

It is an even further object of the invention to provide an improved micro-coded built-in self-test apparatus wherein a micro-instruction format is utilized for implementing memory BIST algorithms.

It is still another object of the invention to provide an improved micro-coded built-in self-test apparatus wherein a micro-code random access memory is utilized to allow a new test algorithm to be loaded into the memory device.

It is an even further object of the invention to provide an improved micro-coded built-in self-test apparatus wherein the micro-code instruction set may be expanded upon to support pattern sensitive test algorithms.

These and other advantages, objects and features of the invention will become more apparent after considering the following description taken in conjunction with the illustrative embodiment in the accompanying drawings.

BRIEF DESCRIPTION OF THE PREFERRED EMBODIMENT

Micro coding techniques have been used for a number of years for the design of central processing units (CPU) and other state machines. It has also been used in some memory testing schemes, but not any that can support the data-retention fault detection. Micro coding allows flexible coding of the random access memory (RAM) test algorithms. A single sequencer is utilized and is implemented using random-logic. Changing the test algorithm involves only changing the micro-ROM.

A micro-coded control unit is principally comprised of a memory rather than a large network of flip-flops and logic for generating test input. The memory is usually a read only memory (ROM) and the stored instructions are called micro-instructions or micro-code. Each micro-instruction can direct bus connections and control signals to arithmetric logic units (ALU), counters, decoders, etc. Furthermore, a micro-instruction can branch to other micro-instructions based upon certain prespecified conditions or unconditionally.

The micro-code sequencer unit fetches each micro-instruction from the read only memory and performs the rudimentary operations. The micro-sequencer can be as simple as assigning each bit of the micro-instruction word to individual lines in the controller. It would then continue on to the next instruction. This is known as horizontal coding, because no part of the micro-instruction word is encoded. An encoding field for many functions is more complex, but allows a large number of operations to be performed with a small word length instruction.

Micro-coding allows differing test algorithms to be built-into similar random access memory devices of a manufacturer's family. Built-in self-test memory test algorithms can be stored in the micro-code read only memory. The more expensive and more reliable devices may contain a larger micro-code read only memory with a sophisticated test algorithm.

Writing a test algorithm in micro-code is easier than creating the random logic for the same test function. The micro-code language is optimized for memory testing. Small instructions can execute several operation simultaneously.

Figure 1:
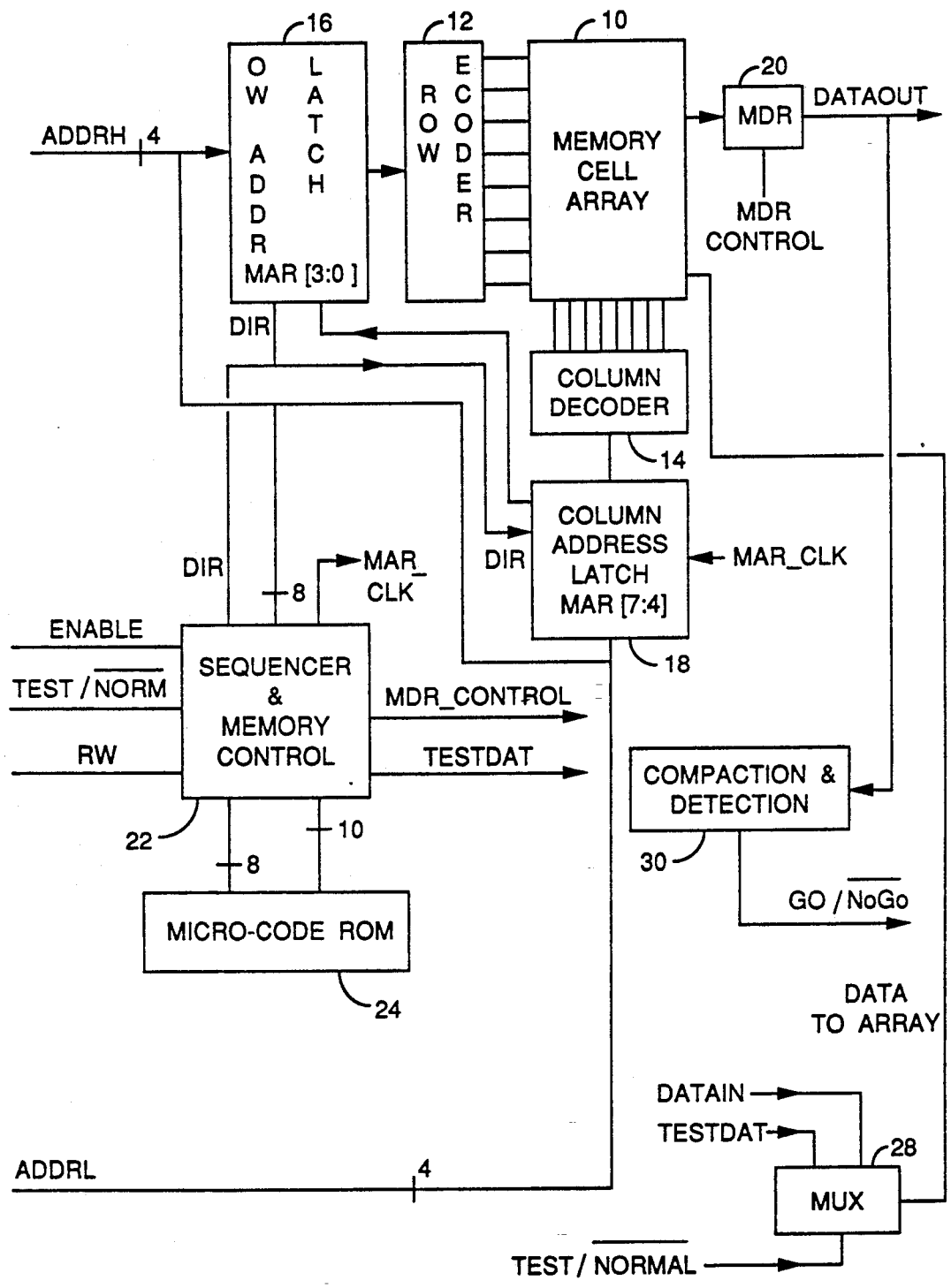
FIG. 1 is a block diagram of the micro-coded built-in self-test apparatus for a memory cell array according to the present invention.

Referring now to FIG. 1 there is shown a block diagram of the micro-coded built-in self-test memory apparatus. The memory cell array 10 which is utilized for the present example comprises a 16×16 array of 256 cells that is driven by row and column address decoders, 12 and 14. The 1-of-16 decoders accept input from memory address register, (MAR) 16, 18. The row address is supplied by bits 0-3 of memory address register and the column address is supplied by bits 4-7 of MAR 18. The memory data register is made into an up/down counter to facilitate the linear address generation required by the test algorithm. The memory data register 20 is clocked by signals from the sequencer unit 22, which also indicate the direction of the count. During normal memory operation (when test/normal is low), the memory address registers 16, 18 simply act as a latch to hold the address information. The micro-code read only memory unit 24 stores the micro-instructions which are supplied to the sequencer and memory control unit 22. Test data from the sequencer and memory control unit 22 is applied to multiplexer unit 28. When the memory is utilized in normal operation, the test/normal signal to both the sequencer and memory control unit 22 and the multiplexer unit 28 is a digital zero or low, the multiplexer unit 28 applies data into the memory cell array 10. When the test/normal signal is a digital one or higher, test data to the multiplexer unit 28 is applied to the memory cell array 10. The test data output of the memory cell array 10 is applied through the memory data register 20 to the compaction and detection unit 30. The compaction and detection unit 30 determines whether the test data output from the memory cell array 10 is valid and generates a signal, go/nogo which indicates the operational status of the memory cell array 10.

Figure 2:
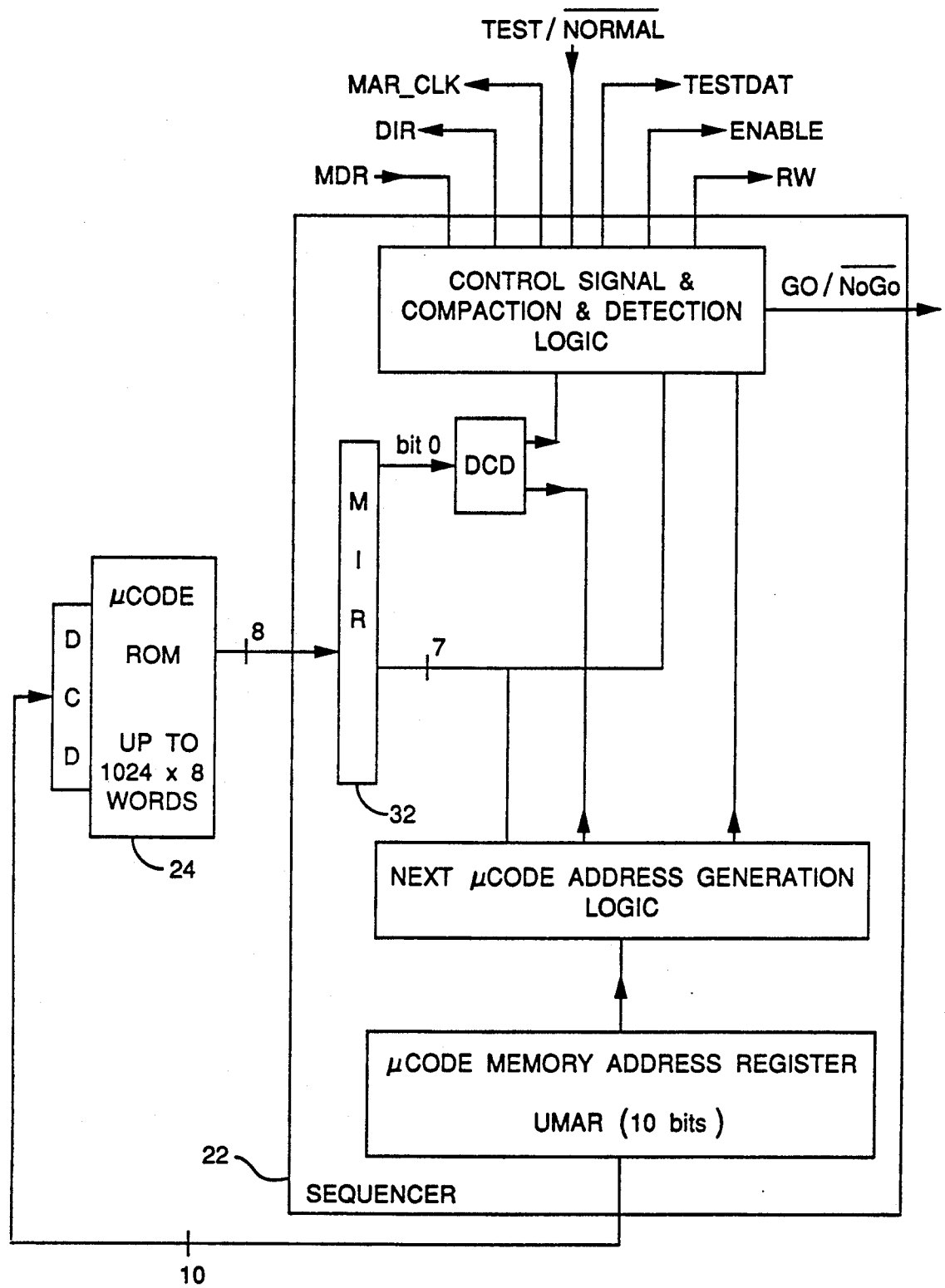
FIG. 2 is an expanded block diagram of the micro-code sequencer unit.

The micro-sequencer 22 and micro-code read only memory 24 are shown in greater detail in FIG. 2. The micro-code instruction register (MIR) 32 receives and holds the fetched micro-instruction from the ucode read only memory 24. Then next address logic is generated based upon the contents of micro-code instruction register 32. Instructions can also cause sequential actions to take place (such as a write or read, or load a register, etc) or may set signal lines to the required logic value.

The test data compaction and detection unit 30 is used to determine if the result of the test is indicative of a good memory device, and subsequently sets go/nogo to reflect this status.

There are two basic instruction types transfer and branch. Branch instructions allow the micro-instruction sequence to branch unconditionally to a new instruction, or to branch based upon a condition. The conditional branches allow loops to be written in the micro-code.

Transfer instructions grant access to the memory and its control signals. They also provide commands to load the memory address register, clock it (to increment or decrement it), enable or disable the memory, set the write data line, delay for data retention, and load the cyclic redundancy check with its seed value.

There is shown in Tables 1 and 2 the micro code instruction format which is utilized for instructions. It provides all of the functions listed above plus enhancement capabilities. The micro-code instructions format for branch instructions is shown in Table 1. First, the branch instructions which are indicated by bit 0 being 0, allow conditional and unconditional branches. Paging of the micro-code read only memory is allowed. Paging allows longer algorithms to be used with this compact instruction set. A new page boundary (page address is specified by bits 9-5 of the micro-code memory address register) may be loaded with execution continuing from the first word on the new page (i.e. 00H, 20H, 40H, 60H etc).

The micro-code instruction format for transfer instructions is shown in Table 2. The transfer instructions which are indicated by bit 0 set to 1, allow several operations to be executed simultaneously. Bit 1 controls the memory enable. Bit 2 indicates whether a read or a write operation is to be performed. Bit 3 will perform either a delay for a period determined by the next two words in micro-code ROM (b5=0;b3=1), perform a CRC check and stop (b5=1;b3=1), or do nothing (b3=0). The two active operations are performed when B3=1 according to the contents of the direction flag, DIR (b5). This vertical coding method is used to provide more functions than there are bits allocated to the transfer instruction.

TABLE 1

MICRO-CODE INSTRUCTION FORMAT FOR BRANCH INSTRUCTIONS

Branch microinstructions:

| 7 | 6 | 5 | 4 | 3 | 2 | 1 | 0 |
|---|---|---|---|---|---|---|---|
| ADDRESS INFO ||||| CONDITION ||  0 | b7:3
address  : address is absolute if COND<>01
         : address is new page if COND=01
b2:1
COND    : branching conditions:
          0 0 : absolute, no condition
          0 1 : load new page from address field (page=b9:5 of uMAR)
          1 0 : +/MAR
          1 1 :—(&/MAR)

TABLE 2

MICRO-CODE INSTRUCTION FORMAT FOR TRANSFER INSTRUCTIONS

Micro-code words are coded as follows:
Transfer microinstructions:

| 7 | 6 | 5 | 4 | 3 | 2 | 1 | 0 |
|---|---|---|---|---|---|---|---|
| function sets || DIR | mar clk | delay-CRC ck | rw | e | 1 | b7:6 Function Sets
00 - - set testdat=0
01 - - set testdat=1
10 - - Load MAR
    if DIR = 1 then MAR=all 1's
    if DIR = 0 then MAR=all 0's
11 - - reset CRC to seed value. Note, next four words are read for seed.

b5 direction of linear address sequence
DIR  : 1 MAR          When delay=1;   1=Final compare,
       is incremented.                next word=mask
     : 0 MAR                          0=Delay is next
       is decremented.                two words.

b4 MAR clock (used to enable inc/dec of MAR)
mar_clk  : 0 No change in MAR from inc/dec function
         : 1 MAR is incremented or decremented using DIR as qualifier.
             DIR=0 MAR is decremented
             DIR=1 MAR is incremented b3 delay-CRC check TABLE 2-continued

MICRO-CODE INSTRUCTION FORMAT FOR TRANSFER INSTRUCTIONS del_CRC : 1 if DIR=0, next two microcode words are delay value.
If DIR=1 Go/NoGo is set and sequencer action halts. (see DIR above).
: 0 no action.

b2 read write control rw : 0 Micro sequencer will perform a read operation from MAR addressed cell.
CRC is automatically clocked with new data read.
Data is available at MDR.
Enable must be active, also.
: 1 Write testdat into memory at addressed location.

b1 enable control e : 1 enable=1. Memory cell and logic enabled. Performs exactly the same function as the external enable.
: 0 enable=0. No operation performed.

Bit 4 (mar_clk) of the transfer micro instruction is used to clock the memory address register. Either an increment or decrement will occur based upon the contents of bit 5 (DIR). Bit 5 (DIR) indicates the direction of the count (1=increment, 0=decrement).

Bits 7 and 6 (function sets) are vertically coded to indicate one of four possible functions. The functions are to set the write data (testdat) to either 1 or 0, load the MAR with all 1's or all 0's, and to reset the cyclic redundancy check to the seed value. The seed value is predetermined so that a fault-free signature results in a cyclic redundancy check value of 0.

There is a built-in expansion capability inherent in the present apparatus. The expansion capabilities lie in the use of pages of instruction memory. One page of microcode is 32 instruction words long (32-8 bit words). The branch instruction allows the loading of the upper 5 bits of the micro-code memory address register. This yields 32 pages which contain 32 instructions each, or 1024 micro-code instructions. With this much addressable space for instructions, long test algorithms can be incorporated.

It should be noted that the micro-code size is independent of the size of the memory cell array. The only constraint on micro-code size is that it be less or equal to 1024 words. The memory cell array may be any size. In the simulations of the present invention, a memory cell array of 256 bits was used to keep the time for a simulation reasonable.

Not many more expansion capabilities can be achieved with the current instruction format without giving up instruction size or the ability to perform simultaneous operations. The current instruction set is based upon the operations needed and the vertical coding and dual use of bits during certain instruction sequences.

Future expansion of the basic instruction set could be based upon a larger micro-code instruction register or by a post-byte which would indicate new commands. For the linear test sequences which is utilized here, the apparatus shown in FIGS. 1 and 2 is more than adequate.

One potential source of expansion resides with the branch unconditionally statement. Not allowing branching to the same micro-instruction could be used as a taken to fetch the next word, which could be part of an expanded instruction set. This would maintain the compact size of the current instruction set design, while providing limited expansion abilities.

The micro-assembly language which is rather simple. Each bit, or set of bits, is described by a mnemonic for the operation desired and the value it should be set. Branch operation is shown in standard AHPL (a hardware programming language) transfer statements, although the branch destination is contained within the micro code. Also, the conditions for branching are limited to the micro code instruction set limitations.

The mnemonics correspond to the names of the bits for each field of the instruction format shown in Tables 1 and 2.

There are several data compression methods known and described in the literature, and in use such as: one's count, transition count, and linear feedback shift registers (LFSR). Linear feedback shift registers are referred to as cyclic redundancy checking (CRC) when the feedback paths are from the last stage and the first stage in an m stage shift register. The term CRC will be used here. The LFSR method was chosen because it is simple to implement and results in a low probability of masking (errors being masked during or by the compression method). Also, when errors are detected, the resulting signature differs from the correct signature (large Hamming distance).

The probability of masking for an m-bit shift register is given by the following equation:

$$P(M) = \frac{2^{k-m} - 1}{2^k - 1} \approx 2^{-m}$$

To achieve a high degree of masking, a large number of bits for the CRC register is desireable.

A 32 bit cyclic redundancy check register was utilized mainly because it is the largest convenient value to use with the a hardware programming language simulator, and with 32 bits a very low probability of masking occurs (as will be seen). With m=32, $$P(M) = 2^{-32} = 2.3283 \times 10^{-10}$$

or in terms of percent is $2.3283 \times 10^{-8}$.

With 10 reads to each of the 256 memory locations for the 13N test, the probability of a masking error causing faulty chip to pass the built-in self-test is $2^{-32} = 2.3283 \times 10^{-8}$ or typically 1 in every 4 billion chips.

If the compression method used in the built-in self-test approach were used with other size memory arrays, the calculations shown above would need to be performed. A decision on the cyclic redundancy check word length could then be made.

The CRC register is seeded with a predetermined value which will result in a signature of zero if the test found no errors. The value of zero makes it convenient to test for an error when the test is finished and is more easily identified on simulation printouts.

The seed must be loaded initially before any reads. A command in the instruction repertoire allows the cyclic redundancy check to be seeded from micro-code read only memory.

In order to verify correct operation of a fault-free simulation, a correct CRC seed word needs to be generated. The program in Listing 1 is a BASIC program which will generate the CRC seed for a 13N Test. Listing 2 is a similar program for the 36N with data retention.

The independent programs were used to find fault-free cyclic redundancy check values to eliminate any built-in errors which may have occurred if the fault-free cyclic redundancy check were taken directly from the simulation. BASIC programs to use the seed value to compute the final CRC were also written to independently verify the memory's operation. These are shown in Listings 1A and 1B.

Figure 3:
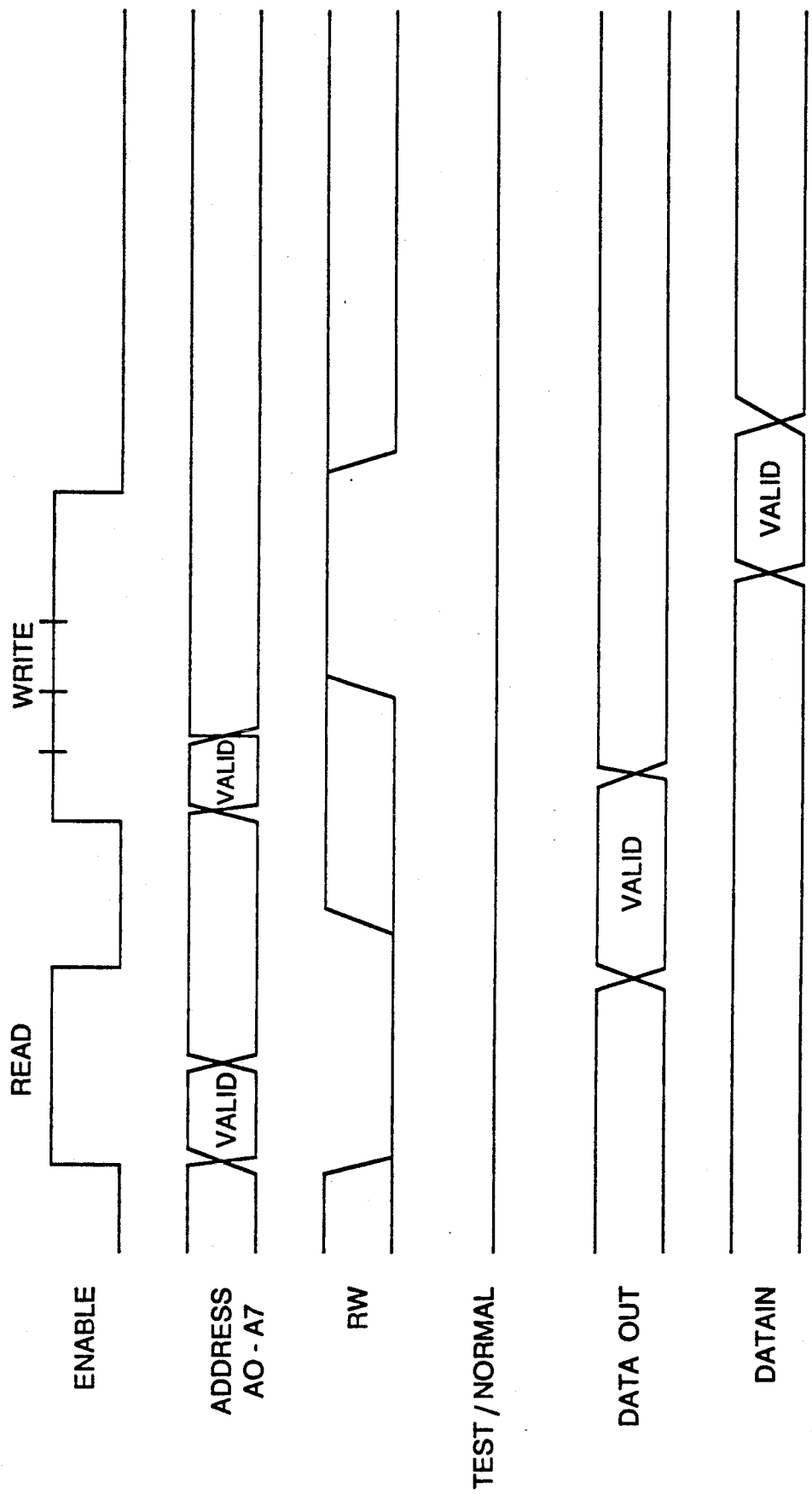
FIG. 3 is a graphical representation of the timing diagram for the micro-coded built-in self-test apparatus for memory operation in the normal mode.

The normal operation of a memory cell array is as follows. A normal memory operation such as read & write, takes place when signal test/normal is low. In the simulation, extra clock cycles are needed because of the limitations of a hardware programming language simulator. Normally, a single read or write operation should be able to occur in one read/write cycle of the requesting device. The timing diagram for the memory operation in normal mode is shown in FIG. 3.

Lines 10 through 18 perform normal memory read and write operations. The register XDR is extra and is needed only for a hardware programming language simulation to work. A complete layout of the actual circuit would not include this register and could accomplish a read or write in one cycle.

The micro-code sequencer which performs most of the work is shown in Listing 3. It is written in a hardware programming language (AHPL) and is simulated on an IBM PC.

```
       Listing 1  BASIC program which generates CRC value for a 13N Test.
 1 REM FILENAME: CRCSEED1.BAS
10 REM    13N RAM TEST CYCLIC CODE COMPRESSION SEED GENERATOR
20 REM    L. POPYACK    APRIL 1989
30 REM
40 REM    m=32 bits.  Masking probability of masing approx 1/(2**16)
   REM
60 REM
62 D=32
65 DIM CRC(32)
70 FOR K=0 TO (D-1):CRC(K)=0:NEXT K
80 READ R1,R2: IF R1=999 THEN 150
90 FOR MAR= 0 TO 255
100 IF R1>=0 THEN MDR=R1:GOSUB 190
110 IF R2>=0 THEN MDR=R2:GOSUB 190
120 NEXT MAR
130 GOTO 80
140 REM
150 PRINT "CRC SEED VALUE = ";
155 GOSUB 310
160 REM END
170 DATA -1,1, -1,0, 0,1,1,0,0,1,1,0,999,999
180 END
190 REM    LINEAR FEEDBACK SHIFT REGISTER.
200 REM
210 C1=CRC(D-3)   'GET BIT 29 (30-1) IE. BEFORE SHIFT
220 C2=CRC(D-1)   'GET BIT 31
230 NB=C1 XOR C2 XOR MDR    'GET NEW BIT ZERO
240 FOR K=(D-1) TO 1 STEP -1    'PERFORM SHIFT
245   CRC(K)=CRC(K-1)
248 NEXT K
    CRC(0)=NB                 'NEW BIT ZERO
    RETURN
300 R=0
310 FOR G=(D-1) TO 0 STEP -1
320 PRINT CRC(G);
330 NEXT G
340 RETURN
```

LISTING 1A BASIC PROGRAM WHICH INDEPENDENTLY GENERATES CRC VALUE FOR THE 13N TEST

```
1 REM FILENAME: CRC2_3.BAS
10 REM    13N RAM TEST CYCLIC CODE COMPRESSION CRC GENERATOR
20 REM    L. POPYACK    APRIL 1989
30 REM
40 REM    m=32 bits.  Masking probability of masing approx 1/(2**16)
   REM
60 REM
62 D=32
65 DIM CRC(32)
70 FOR K=0 TO (D-1)
72 PRINT "BIT ";K;"=";
73 INPUT CRC(K)
77 NEXT K
80 READ R1,R2: IF R1=999 THEN 150
90 FOR MAR= 0 TO 255
100 IF R1>=0 THEN MDR=R1:GOSUB 190
110 IF R2>=0 THEN MDR=R2:GOSUB 190
120 NEXT MAR
130 GOTO 80
140 REM
150 PRINT "CRC VALUE = ";
155 GOSUB 310
160 REM END
170 DATA 0,1, 1,0, 0,1, 1,0, 0,-1, 1,-1, 999,999
180 END
190 REM    LINEAR FEEDBACK SHIFT REGISTER.
200 REM
210 C1=CRC(D-2)    'GET BIT 30 (31-1)
220 C2=CRC(0)    'GET BIT 0
230 NB=C1 XOR C2 XOR MDR    'GET NEW BIT ZERO
    FOR K=0 TO (D-2)    'PERFORM SHIFT
      CRC(K)=CRC(K+1)
248 NEXT K
250 CRC(D-1)=NB              'NEW BIT 31
260 RETURN
300 R=0
310 FOR G=(D-1) TO 0 STEP -1
 20 PRINT CRC(G);
330 NEXT G
340 RETURN
```

LISTING 1B BASIC PROGRAM WHICH INDEPENDENTLY GENERATES CRC VALUE FOR THE 36N TEST

```
1 REM FILENAME: CRC3_3.BAS
10 REM    36N RAM TEST CYCLIC CODE COMPRESSION CRC GENERATOR
```

```
20 REM    L. POPYACK    APRIL 1989
30 REM
40 REM    m=32 bits.  Masking probability of masing approx 1/(2**16)
   REM
60 REM
62 D=32
65 DIM CRC(32)
70 FOR K=0 TO (D-1)
72 PRINT "BIT ";K;"=";
73 INPUT CRC(K)
77 NEXT K
80 READ R1,R2: IF R1=999 THEN 150
90 FOR MAR= 0 TO 255
100 IF R1>=0 THEN MDR=R1:GOSUB 190
110 IF R2>=0 THEN MDR=R2:GOSUB 190
120 NEXT MAR
130 GOTO 80
140 REM
150 PRINT "CRC VALUE = ";
155 GOSUB 310
160 REM END
180 END
190 REM    LINEAR FEEDBACK SHIFT REGISTER.
200 REM
210 C1=CRC(D-2)   'GET BIT 30 (31-1)
220 C2=CRC(0)    'GET BIT 0
230 NB=C1 XOR C2 XOR MDR    'GET NEW BIT ZERO
240 FOR K=0 TO (D-2)    'PERFORM SHIFT
245   CRC(K)=CRC(K+1)
    NEXT K
250 CRC(D-1)=NB            'NEW BIT 31
260 RETURN
300 R=0
310 FOR G=(D-1) TO 0 STEP -1
320 PRINT CRC(G);
330 NEXT G
340 RETURN
500 DATA 0,1,1,0,0,-1,0,-1,1,-1,1,-1,0,-1,0,-1,1,-1,0,-1,0,-1,1,-1,1,-1,0,-1
510 DATA 0,-1,1,-1,999,999
```

Listing 2  BASIC program which generates CRC value for a 13N Test.

```
1 REM FILENAME: CRCSEED2.BAS
10 REM    36N RAM TEST CYCLIC CODE COMPRESSION SEED GENERATOR
20 REM    L. POPYACK    APRIL 1989
30 REM
40 REM    m=32 bits.  Masking probability of masing approx 1/(2**16)
 : REM
60 REM
```

```
62 D=32
65 DIM CRC(32)
70 FOR K=0 TO (D-1):CRC(K)=0:NEXT K
80 READ R1,R2: IF R1=999 THEN 150
90 FOR MAR= 0 TO 255
100 IF R1>=0 THEN MDR=R1:GOSUB 190
110 IF R2>=0 THEN MDR=R2:GOSUB 190
120 NEXT MAR
130 GOTO 80
140 REM
150 PRINT "CRC SEED VALUE = ";
155 GOSUB 310
160 REM END
170 DATA -1,1, -1,0
171 DATA -1,0, -1,1, -1,1, -1,0, -1,0, -1,1, -1,0, -1,0, -1,1, -1,1, -1,0
172 DATA -1,0, 0,1, 1,0
173 DATA 999,999
180 END
190 REM      LINEAR FEEDBACK SHIFT REGISTER.
200 REM
210 C1=CRC(D-3)    'GET BIT 29 (30-1) IE. BEFORE SHIFT
220 C2=CRC(D-1)    'GET BIT 31
230 NB=C1 XOR C2 XOR MDR    'GET NEW BIT ZERO
240 OR K=(D-1) TO 1 STEP -1    'PERFORM SHIFT
245 CRC(K)=CRC(K-1)
248 NEXT K
250 CRC(0)=NB                'NEW BIT ZERO
260 RETURN
300 ?=0
310 FOR G=(D-1) TO 0 STEP -1
320 PRINT CRC(G);
330 NEXT G
340 RETURN
```

"Filename: MICRO3.CNT             Listing 3  AHPL micro-code sequencer.

This program simulates a RAM with a Built-In Self Test (BIST).
Normal operation of the RAM occurs as shown in line 10-18 (Non-test mode).
When the test pin is high, the RAM will self-test. The RAM memory
    algorithm is contained in the micro-code.

Data-Retention is tested in MICRO1A.

The memory is organized as a square matrix of cells (16 rows by 16 columns) forming 256 memory cells.

The BIST is micro-coded. This AHPL describes the micro coded sequencer.

Control Section."

```
AHPLMODULE : bisttgl.
  MEMORY    : M<16>[16]; MDR;MAR[8];   "16 col by 16 rows = 256 cells"
              UCODE<1024>[8];
              XDR[16];                 "Needed only by AHPL"
              CRC[32];                 "Data Compression register"
              UMAR[10];                "Micro-code address register"
              MIR[8];                  "Micro-code data register"
              MASK[16].
  EXINPUTS  : ADDRH[4];ADDRL[4];       "10-bit address input"
              test; rw; enable;
              datain.
  OUTPUTS   : dataout; gonogo.         "data output, testmode go/nogo signal"
  CLUNITS   : DCD1[16](4); DCD2[16](4);"Row , Column decoder"
              INC[8] (8);              "INC function for MAR loops"
              INC1[16] (16);
              INC2[10] (10);
              DEC2[16] (16);
              DCD3[1024] (10);
              DCD4[4] (2);
              DCD5[4] (2);
              DEC[8] (8).

BUSES     : marclk; direction;testdat;"signals to MAR to increment (or dec) and
                                         direction of linear count. 1=low-high
                                         0=high-low"
              ROW[16]; COL[16].         "ROW and COL busses."
```

```
********************************************************************************
******   NORMAL OPERATION --- also detects test mode operation        ******
********************************************************************************
```

10 MAR[3:0] * enable <= ADDRH ; MAR[7:4] * enable <= ADDRL;
   => (˜enable,test) / (10,20).

11 ROW = DCD1(MAR[3:0]); COL=DCD2(MAR[7:4]).

15 MDR * (˜rw & enable ) <= +/((M * DCD1(MAR[3:0])) & COL);
   -> (˜rw & enable ) / (10).  "RETURN IF ONLY READ"

17 XDR <= M * DCD1(MAR[3:0]).

18 M * DCD1(MAR[3:0]) <= ((˜COL & XDR) ! (XDR + COL)) * (˜datain,datain);

Listing 3 AHPL micro-code sequencer.

=> 10.

**************************************************************
*** Built-in Self Test Mode -- Micro code sequencer    ****
**************************************************************

```
20    UMAR <= 10$0.                           "uC start @ 0000"
30    MIR <= UCODE * DCD3(UMAR).              "Load the uInstruction Register"

35    => (MIR[0])/(100).            "Goto 100 if uC instruction is a TRANSFER"
"*----------------------------------------------------------------*"
"* BRANCH MICRO INSTRUCTIONS                                      *"
"*----------------------------------------------------------------*"

40    => (DCD4(MIR[2:1])) / (60, 55, 45, 50).
      "branch microinstructions MIR[2:1]=11,10,01,00
45    UMAR <= MIR[7:3] , 5$0;                          "load new page"
      => 30.          "execute next micro instruction on new page boundary"
50    UMAR[4:0] <= MIR[7:3];      "absolute, same page, unconditional branch."
      => 30.

55    UMAR[4:0] * (+/MAR) <= MIR[7:3]; "absolute, same page, branch cond: +/MAR"
      =>((+/MAR),`(+/MAR)) / (30, 65).
60    UMAR[4:0] * (`(&/MAR)) <= MIR[7:3] ; "absolute, same pge, cond: `(&/MAR)"
      =>(`(&/MAR)) / (30).

65    UMAR <= INC2(UMAR);       "update uMAR; execute next micro instruction"
      => 30.
"*----------------------------------------------------------------*"
"* TRANSFER  MICRO-INSTRUCTIONS                                   *"
"*----------------------------------------------------------------*"

1     enable=MIR[1];                                 "set enable signal"
      => (MIR[3]) / (200).            "if delay instruction,perform delay"

"decode and perform function sets"

120   => (DCD5(MIR[7:6])) / (140, 130, 125, 125).           "11, 10, 01, 00"
125   testdat = MIR[6];    "set the memory data input word to either 0 or 1"
      => 150.
130   MAR <= (8$0 ! `(8$0)) * (`MIR[5], MIR[5]);  "Load the MAR with 1's or 0's"
      => 150.
140   gonogo=\0;                              "clear the go/nogo output line"
```

```
        UMAR <= INC2(UMAR).                               "must get CRC seed-Hi"
141     CRC[31:24] <= UCODE * DCD3(UMAR).                 " CRC seed    ; high word"
142     UMAR <= INC2(UMAR).
143     CRC[23:16] <= UCODE * DCD3(UMAR).                 " CRC seed"
144     UMAR <= INC2(UMAR).
145     CRC[15:8] <= UCODE * DCD3(UMAR).                  " CRC seed"
146     UMAR <= INC2(UMAR).
147     CRC[7:0] <= UCODE * DCD3(UMAR);
        => 65.                                            "go on to the next micro-instruction"

"read and write operations"

150     rw=MIR[2];                                        "set the rw line"
        => (`MIR[1]) / (170).                             "if not enabled, continue"
160     ROW=DCD1(MAR[3:0]); COL=DCD2(MAR[7:4]).           "read"

165     MDR * (`rw & enable ) <=  +/((M * DCD1(MAR[3:0])) & COL).
166     CRC[31:0] * (`rw & enable ) <= (MDR @ CRC[30] @ CRC[0]),CRC[31:1];
        => (`rw & enable ) / (170).          "done. now check for inc/dec u inst."

167     XDR <= M * DCD1(MAR[3:0]).                        "write"

M * DCD1(MAR[3:0]) <= ((`COL & XDR) | (XDR + COL)) * (`testdat,testdat).
                                             "done. now check for inc/dec u inst."

"Increment/Decrement Operations"

170     => (`MIR[4]) / (65).                              "check for inc/dec"
175     MAR <= (INC(MAR) | DEC(MAR)) * (MIR[5], `MIR[5]);"inc or dec per qualifier"
        => 65.                                            "next microinstruction"

"Delay or CRC check"

200     => ( MIR[5]) / (340).                             "do CRC check"

300     UMAR <= INC2(UMAR).                               "must get delay value"
310     MASK[15:8] <= UCODE * DCD3(UMAR).                 " delay count : high word"
315     UMAR <= INC2(UMAR).
316     MASK[7:0] <= UCODE * DCD3(UMAR).
320     MASK <= DEC2(MASK);                               "wait and return"
"       K<1>[2] <= \1;  *************** Data-Retention Error ************************"
        => (`(+/MASK),(+/MASK)) / (65, 320).
"**************************************************************************"

340     gonogo = `(+/CRC).                    "CRC check and set go/nogo"
```

```
ENDSEQUENCE
CONTROLRESET (10).
"The following ALWAYS ACTIVE statements do not work with the AHPL simulator"
    datain = (testdat ! datain ) * (test , 'test).  "assign the input data path"
END.
```

The normal operation of the memory (test/nor mal=0) is performed in lines 10-18. A timing diagram of the simulated memory's operation in normal mode is shown in FIG. 3. Simulated read and write operations are sent to the memory array. Line 10 detects when the memory has been placed into test mode. When this occurs, line 20 is executed which is the first line of the micro-sequencer.

Basically, there are two sections to the sequencer, one for branch instructions and the other for transfer instructions. The branch instructions are performed by lines 40-65. Line 65 is universal in that it is used to update the memory address register and proceed to the next instruction.

Transfer instructions are decoded and executed in a priority fashion, although many operations may be defined in one micro-instruction. First, the function sets are decoded and executed. If the cyclic redundancy check seed operation was specified as a micro-instruction, then this is the only operation performed during this micro-instruction cycle. All other bits are meaningless.

Read and write operations are performed next (lines 150-168). It may be noted that the enable signal is used just like the normal mode memory read & write operations. Also, with each read, the value read from the memory data register is shifted into the data-compression register. The cyclic redundancy check is clocked with each memory read.

The increment or decrement operations are performed next if necessary. Control continues to the next micro-instruction (via line 65).

The delay or cyclic redundancy check and end instruction causes either a delay based upon the next two words in the UCODE random only memory or checks the cyclic redundancy check for zero and sets go/nogo appropriately. Line 100 checks for its presence in the instruction and lines 200-300 do the work. Delay is simply a down counter clocked at the sequencers own clock rate. The delay value is initially loaded into MASK from the next two 8-bit words of the micro-instruction sequence. The CRC check should be zero with a fault free memory. A simple NORing of the bits in line 340 sets go/nogo.

The present apparatus may be expanded in support of P1149, Testability Bus Support. The micro-code read only memory may be changed to a random access memory, thus allowing a new test algorithm to be loaded into the memory device. The micro-code instruction set may be expanded upon to support pattern sensitive test algorithms.

Although the invention has been described with reference to a particular embodiment, it will be understood to those skilled in the art that the invention is capable of a variety of alternative embodiments within the spirit and scope of the appended claims.

What is claimed is:

1. A micro-coded built-in self-test apparatus for a memory array comprising in combination:

a memory cell array having a predetermined number of cells, said memory cell array receiving input data which includes test data and control signals and providing an output data signal, said memory cell array including a row decoder and a column decoder, a read only memory storing a plurality of micro-instructions therein, and a sequencer and control means operatively connected to said read only memory to receive said micro-instructions therefrom and to generate a micro-code memory address signal, said sequencer and control means including:

a micro-code instruction register to receive said micro-instructions from said read only memory, means for decoding, said decoding means decoding the instruction bit of said micro-instructions and providing a first control signal and a second control signal, a control signal/compaction and detection logic unit receiving said first control signal and said micro-instructions from said decoding means, said control signal/compaction and detection logic unit providing said control signals and said test data to said memory cell array, said control signal/compaction and detection logic unit receiving said output data signal from said memory cell array and providing a go/nogo signal in response thereto, an address generation logic unit receiving said micro-instructions from said micro-coder instruction register, said address generation logic unit receiving said second control signal from said decoding means and receiving said go/nogo signal from said control signal/compaction and detection logic unit, said address generation logic unit generating the next micro-code address, and a micro-code memory address register to receive said next micro-code address from said address generation logic unit, said micro-code memory address register providing said micro-code memory address signal to said read only memory, wherein said go/nogo signal reflects the status of said memory cell array.

2. A micro-coded built-in self-test apparatus as described in claim 1 wherein said memory cell array comprises a random access memory.

3. A micro-coded built-in self-test apparatus as described in claim 2 wherein said random access memory comprises an n x m memory array.

4. A micro-coded built-in self-test apparatus as described in claim 1 wherein said predetermined number cells comprise 256 memory cells.

5. A micro-coded built-in self-test apparatus as described in claim 1 wherein said plurality of micro-instructions comprise a memory cell test algorithm.

6. A micro-coded built-in self-test apparatus as described in claim 1 wherein said plurality of micro-instructions comprise a predetermined number of test algorithms.

7. A micro-coded built-in self-test apparatus as described in claim 1 wherein each cell of said memory cell array is tested to determine its operational status.

8. A micro-coded built-in self-test apparatus as described in claim 1 wherein said micro-instructions comprise branch instructions.

9. A micro-coded built-in self-test apparatus as described in claim 1 wherein said micro-instructions comprise transfer instructions.

* * * * *